United States Patent [19]

Chevallier

[11] Patent Number: 5,072,194
[45] Date of Patent: Dec. 10, 1991

[54] DIFFERENTIAL AMPLIFIER WITH CAPACITIVE COUPLING

[75] Inventor: Gilles J. J. Chevallier, Langrune sur Mer, France

[73] Assignee: U.S. Philips Corporation, New York, N.Y.

[21] Appl. No.: 570,091

[22] Filed: Aug. 20, 1990

[30] Foreign Application Priority Data

Aug. 25, 1989 [FR] France .................................. 89 11241

[51] Int. Cl.$^5$ ................................................ H03F 3/45
[52] U.S. Cl. ........................................ 330/260; 330/294
[58] Field of Search ............... 330/252, 260, 244, 302, 330/311, 107, 109

[56] References Cited

U.S. PATENT DOCUMENTS 4,926,135  5/1990  Voorman ..................... 330/294 X
4,973,917  11/1990  Johnson ..................... 330/260 X Primary Examiner—Steven Mottola
Attorney, Agent, or Firm—Bernard Franzblau

[57] ABSTRACT

A differential amplifier of the cascode type includes a differential stage having a first ($T_1$) and a second ($T_2$) transistor, whose emitters are connected to a first ($I_1$) and a second ($I_2$) current source, respectively, and are connected to each other through a first resistor ($R_{12}$). The collectors of the first and second transistors are connected to an active load constituted by the collector-emitter path of a third ($T_3$) and a fourth ($T_4$) transistor, respectively, in series with a second ($R_3$) and a third ($R_4$) resistor, respectively, of which one terminal is connected to a supply voltage source. The third and fourth transistors have their bases connected to a reference voltage source. The base of the first and second transistor are connected through a first ($C_1$) and a second $C'_1$) capacitor to a current generator equivalent to a voltage source in parallel with an impedance. In order to improve the current coupling at the input of the amplifier in the case where the impedance is not a self-impedance, a third ($C_2$) and a fourth ($C'_2$) capacitor are arranged in series with a first ($R_{51}$) and a second ($R_{61}$) negative feedback resistor, respectively, between the current generator and a first and a second output, respectively, of the amplifier.

12 Claims, 2 Drawing Sheets

DIFFERENTIAL AMPLIFIER WITH CAPACITIVE COUPLING

BACKGROUND OF THE INVENTION

The present invention relates to an amplifier comprising a differential stage having a first and a second input as well as a first and second output, the first and the second input being coupled through a first and a second capacitor to a first and a second input terminal, respectively, and the first and the second output being coupled to a first and a second output terminal, respectively, the input terminals being coupled through a first and a second feedback resistor to the output terminals.

Such an amplifier has already been described in French Patent Application 88 15958 filed on Dec. 6, 1988 by the Applicant. In this Application the output of the stage which drives the amplifier acts as a current source $I_o$ of given frequency, parallel to which is arranged a parallel self-capacitance filter $L_o, C_o$. Two capacitors C and C' arranged in series at one of the inputs of the amplifier make it possible to eliminate the D.C. components without disturbing the filtering and to obtain a small reactive part at the input of the amplifier.

The value of the capacitors C and C' depends upon the value of the impedance parallel to the current source $I_o$. In the case of a filter, too small a value disturbs the latter. In the case of a resistive impedance, too small a value induces an insufficient current coupling.

SUMMARY OF THE INVENTION

The invention has for an object to provide a capacitive coupling which makes it possible to eliminate the D.C. components, but which is less critical as to its functioning with respect to the value of the impedance parallel to the current source $I_o$.

For this purpose, the amplifier is characterized in that it comprises a third and a fourth capacitor arranged in series with the first and the second feedback resistor, respectively, between the input terminals and the output terminals.

An amplifier according to the invention is more particularly susceptible to having a global mutual impedance, that is to say the ratio between its output voltage $V_s$ and the strength $I_o$ of the current source, which depends to a smaller extent upon the impedance $Z_s$ of the current source than is customary in amplifiers according to the prior art.

According to an embodiment, the differential stage is of the cascode type and comprises a first and a second transistor, whose emitters are coupled to a first and a second current source, respectively, and are coupled to each other by a third resistor, and whose collectors each are coupled to an active load constituted by the collector-emitter path of a third and a fourth transistor, respectively, in series with a fourth and a fifth resistor, respectively, coupled to a supply voltage terminal. The third and the fourth transistor have their bases coupled to a reference voltage terminal. The amplifier may comprise a fifth and a sixth transistor, whose bases are coupled to the collectors of the third and fourth transistors, respectively, whose emitters, which constitute the said first and second outputs of the amplifier, are coupled to said first and second feedback resistors, and whose collectors are coupled to said reference voltage terminal.

In order to compensate, at least in part for the input level shifts, a sixth resistor can be arranged between, on the one hand, the junction point between the first resistor and the third capacitor and, on the other hand, the base of the first transistor. Furthermore, a seventh resistor is connected between on the one hand, the junction point between the second resistor and the fourth capacitor and, on the other hand, the base of the second transistor.

According to a preferred embodiment, the value of each of the first, second, third and fourth capacitors is such that the differential negative feedback input impedance of the amplifier has a reactive part, which does not exceed 15% of the impedance in the whole operating frequency range of the amplifier.

BRIEF DESCRIPTION OF THE DRAWINGS

The invention will be understood more clearly by reading the following description, given by way of non-limitative example, with reference to the drawings, in which.

DESCRIPTION OF THE PREFERRED EMBODIMENTS

Figure 1:
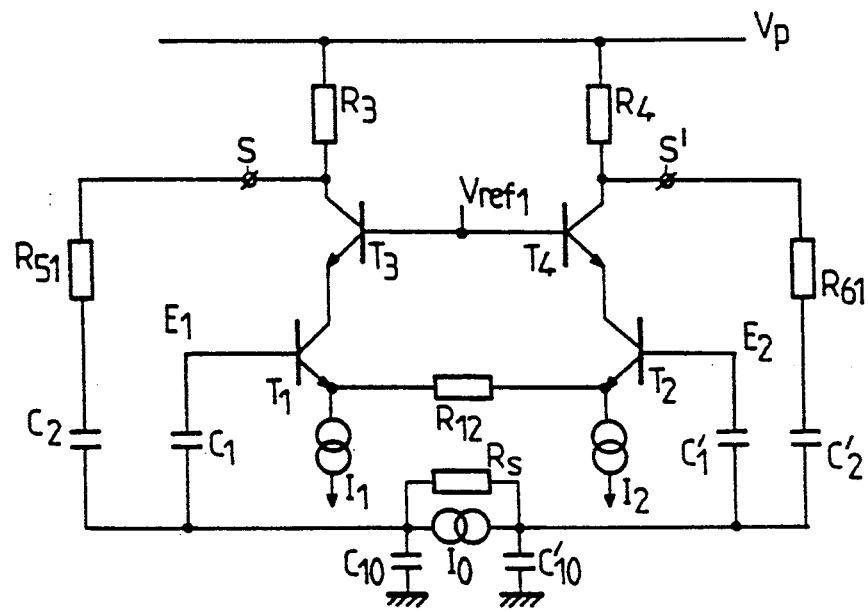
FIG. 1 shows a circuit diagram of an amplifier according to the invention.

According to FIG. 1, two transistors $T_1$ and $T_2$, whose emitters are connected through a resistor $R_{12}$, constitute a differential pair, the bases of the transistors $T_1$ and $T_2$ constituting inputs $E_1$ and $E_2$, respectively, of the amplifier. Two current sources $I_1$ and $I_2$ are connected to the emitters of $T_1$ and $T_2$, respectively. The function of the resistor $R_{12}$ is to improve the linearity of the differential stage.

Two transistors $T_3$ and $T_4$, which may have smaller dimensions on an integrated circuit than the transistors $T_1$ and $T_2$, form with the latter a cascode arrangement. Their bases are interconnected and applied to a reference potential Vref1. Their collectors are connected to a supply voltage source $V_p$ through resistors $R_3$ and $R_4$, respectively, and their emitters are connected to the collectors of the transistors $T_1$ and $T_2$, respectively.

The amplification of the amplifier has the theoretical value:

$$A = \frac{R_3 + R_4}{R_{12}}$$

The inputs $E_1$, $E_2$ of the amplifier are connected to the output of a stage operating as a current source and having an impedance, which is essentially not a self-impedance and is represented by the resitor $R_s$ and two capacitors $C_{10}$ and $C'_{10}$ which, for example, correspond to parasitic capacitances. The current source $I_o$ is connected to the inputs $E_1$ and $E_2$ through capacitors $C_1$ and $C'_1$ and to the negative feedback resistors through capacitors $C_2$ and $C'_2$.

Figure 2A:
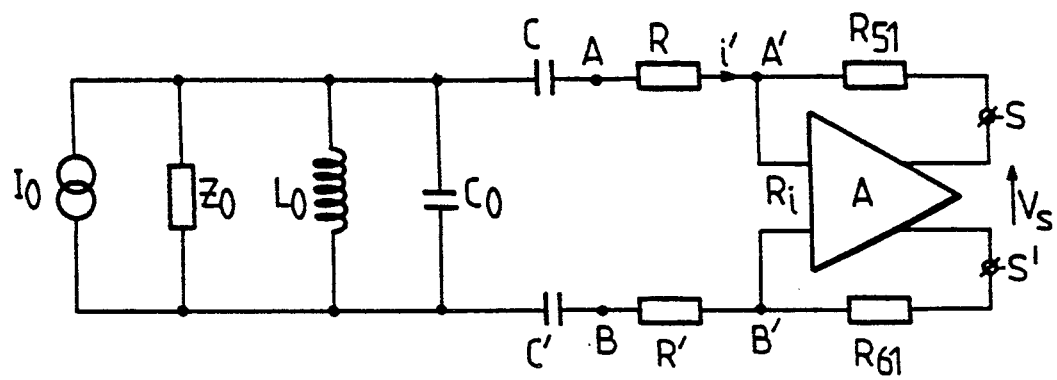
FIGS. 2a and 2b show an equivalent circuit diagram of the circuit described in the aforementioned Application and a circuit diagram, respectively, illustrating the problem arising in the case of the invention.
Figure 2B:
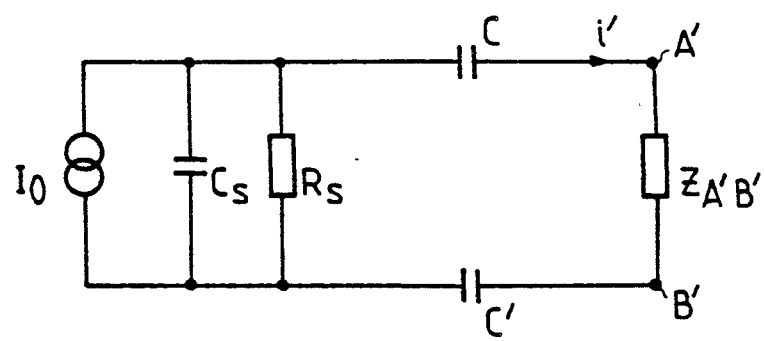
Figure 3:
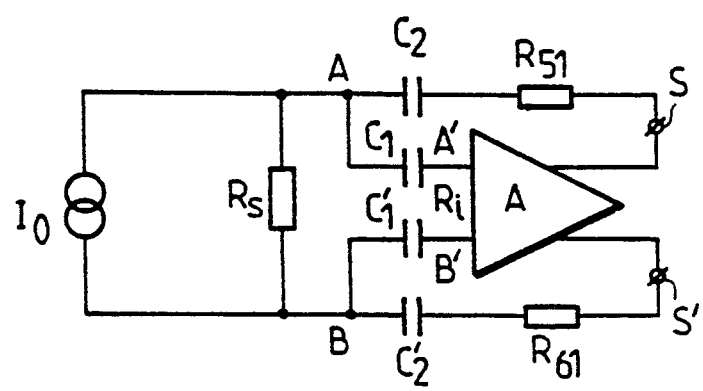
FIG. 3 shows a circuit diagram corresponding to the present invention.

As will now be shown with reference to FIGS. 2a, 2b and 3, this double capacitive coupling make it possible to improve the transfer of the current $I_o$ to the mutual impedance amplifier.

FIG. 2a illustrates the case of the circuit described in French Patent Application No. 88 15958 mentioned above. In a given case, the current source $I_o$, having an intrinsic impedance $Z_o$, is associated with a parallel resonant circuit Lo, Co (for example, the output stage of a mixer). The coupling to the inputs of the differential stage (represented by an amplifier A having an input impedance $R_i$ and fed back negatively through the resistors $R_{51}$ and $R_{61}$) is composed of two series arangements each comprising a resistor and a capacitor R, C and R', C', respectively (for example, C=C'=25 pF).

At resonance, on the condition that $Z_o$ largely exceeds $Z_{AB}$, $Z_{AB}$ being the differential impedance between the points A and B, there is $i'=I_o$.

In the case of FIG. 2b, there is no longer a resonant circuit and coupled in parallel with the source is a differential capaicitance $C_s$ and a resistor Rs with:

$$\frac{1}{C_s} = \frac{1}{C_{10}} + \frac{1}{C_{10}}$$

The coupling is effected hypothetically in that the known solution is used, i.e. by means of series capacitors C and C', through which the current source $I_O$ "sees" the differential impedance $Z_{A'B'}$. The current i', which arrives at the amplifier, directly depends upon the value of the capacitances C and C'.

Then there is:

$$\frac{i'}{I_o} = \frac{Z_s = Z_{A'B'}}{Z_s + Z_{A'B'} + \frac{1}{jCw} + \frac{1}{jCw}} \text{ with}$$

$$Z_S = \frac{R_s}{1 + jR_sC_s}$$

$R_s$ is a differential resistor corresponding, for example, to the sum of the polarization resistance values of the collectors of transistors of the preceding stage. For a value of 800 l of each of the resistors, there is: $R_s=1600$ l.

In practice, the value of $R_s$ is considerably lower than $Z_o$ (FIG. 2a) (for example: $Z_o=40$ kl). In order to render the ratio $i/I_o$ as close to unity as possible, it is necessary to reduce the terms $Z_{A'B'}$ and the two capacitive terms.

Diminution of the term $Z_{A'B'}$ results in an increase in the value of the voltage amplification of the amplifier A.

To a first approximation, there is:

$$Z_{A'B'} \approx \frac{R_{51} + R_{61}}{A + 1}$$

The term $Z_{A'B'}$ can be diminished by adopting for A the maximum value compatible with an acceptable linearity and a correct stability. In general, $Z_{A'B'}$ is considerably smaller than $Z_s$ (in module) and has little influence.

The diminution of the value of the two capacitive terms makes it necessary to increase the value of the capacitances, which is a substantial disadvantage more particularly for an integrated circuit because of the substantial surface area it requires.

In FIG. 2b the value of the capacitors C and C' can be calculated so as to transmit the current $i_o$ with a loss sufficiently low so that it can be neglected.

If it is considered to a first approximation that $C_s$ does not exert any influence. There is:

$$\frac{i'}{I_o} = \frac{R'_s}{R'_s + \frac{1}{jCw} + \frac{1}{jCw}} \text{ with}$$

$$R'_s = R_s + Z_{A'B'}$$

In the amplifier of mutual impedance (having the value $Z_{21}$), this is translated by a loss with respect to the output voltage $V_s$ (which output voltage is obtained if it is assumed that the coupling capacitors are omitted), which becomes $V'_s < V_s$, $V'_s$ being the output voltage obtained for the same current as before, but in the presence of the capacitors C and C'. There is:

$$\frac{V_s}{V_s} = \frac{i'}{I_o} Z_{21} = \frac{-\alpha R_f}{1 + \alpha} \text{ with}$$

$$\alpha = \frac{AR_i}{R_i + R_f} \text{ and}$$

$$R_f = 2R_{51} = 2R_{61}$$

The mutual impedance $Z_{21}$ is equal to $-R_f$ on the condition that $$\alpha = \frac{AR_i}{R_i + R_f}$$

being much higher than unity.

For a given ratio k between the reactive impedance and the resistive impedance, there is:

$$\frac{V_s}{V_s} = \frac{R_s}{\sqrt{R_s + \frac{4}{C^2w^2}}} = \frac{1}{\sqrt{1 + |k^2|}} \text{ with}$$

$$k = \frac{2}{jR'_sCw} \text{ and if } C = C'.$$

The value of $R_s$ always has an influence on the value of the mutual impedance and therefore it is necessary to design the capacitive coupling as a function of the specified value of $R_s$.

According to the invention (FIG. 3), instead of a series capacitive coupling (capacitors C and C'), a direct coupling is effected and capacitors $C_1$, $C_2$ on the one hand and $C_2$ and $C'_2$ on the other hand are introduced into the amplifier.

The capacitors $C_2$ and $C'_2$ are arranged between the current source $I_o$ and the inputs $E_1$ and $E_2$ of the amplifier, but downstream of the return points A' and B' of the negative feedback. The capacitors $C_2$ and $C'_2$ are arranged in the negative feedback circuit of the amplifier in series with the resistors $R_{51}$ and $R_{61}$, respectively, i.e. $R_f=2R_{51}=2R_{61}$. They are then no longer traversed by a part of the current $I_0$.

On the contrary, the capacitors $C_1$, $C'_1$, $C_2$ and $C'_2$ exert, due to the fact that they are arranged in the negative feedback loop, an influence on the output voltage $V_s$.

The mutual intrinsic impedance $Z'_{21}$ of the amplifier has the value:

$$Z'_{21} = \frac{-\left(R_f + \frac{2}{jC_2w}\right)\alpha}{1 + \alpha}$$

-continued $$\alpha = \frac{A\left(R_i + \frac{2}{jC_1w}\right)}{R_i + \frac{2}{jC_1w} + R_f + \frac{2}{jC_2w}}$$

If it is assumed that:

$$k' = \frac{2}{jR_iC_1w} = \frac{2}{jR_fC_2w},$$

the formula giving $\alpha$ is simplified and there is:

$$\alpha = \frac{AR_i}{R_i + R_f}.$$

$\alpha$ has the same value as in the preceding case on the condition that the ratio $k'$ is the same for $C_1$, $C'_1$ and $C_2$, $C'_2$, and there is:

$$Z'_{21} = -\left(R_f + \frac{2}{jC_2w}\right) = -R_f(1 + k')$$

$$\frac{V_s}{V_s} = \frac{1}{1 + k'} \text{ i.e. } \frac{V_s}{V_s} = \frac{1}{\sqrt{1 + |k'^2|}}$$

For $k = k'$, the same result is obtained as in the preceding case (FIG. 3), that is to say that the contribution of the capacitors to the diminution of the value of the output voltage is the same as before.

The overall mutual impedance $Z'_{21t}$ has the value:

$$Z'_{21t} = \frac{-R_f\alpha_t}{1 + \alpha_t} \text{ with}$$

$$\alpha_t = \frac{AR_iR_s}{R_iR_s + R_sR_f + R_iR_f}$$

If $\alpha_t \gg 1$, there is: $Z'_{21t} \approx Z'_{21} = -R_f$ because $\alpha_t \gg 1$, the value of $R_s$ does not influence the mutual impedance.

It results therefrom that an amplifier can be designed which operates in a large range of values of $R_s$ with the same result as $\alpha_t \gg 1$.

Now it will be shown that this result is susceptible to leading to a lower overall value of the capacitances.

In the case of FIG. 2b, there is in fact: $C_t = C + C'$ $C_t$=overall value of the capacitances. Hence:

$$C_t = \frac{4}{kR_sw}$$

$C_t$ has a value which is higher as $R_s$ is smaller.
In the case of FIG. 1, there is for the same value of $R_s$:

$$C_t = C_{t1} + C_{t2}$$

$$C_{t1} = \frac{4}{kR_iw} \text{ with } \frac{1}{R_i} = \frac{1}{2R_{52}} + \frac{1}{hR} \text{ with}$$

$$\frac{1}{R} = \frac{1}{R_{12}} + \frac{1}{R_1 + R_2},$$

$R_1$ and $R_2$ being resistors constituting the current sources $I_1$ and $I_2$, and h=current amplification of the transistors.

$$C_{t2} = \frac{4}{kR_fw}$$

Let it be assumed that $R_f = n_2 R_s$ $R_i = n_1 R_s$.

If the same ratio k is hypothetically maintained (for equal performances) there is:

$$C_{t1} = \frac{C_t}{n_1} \quad C_{t2} = \frac{C_t}{n_2}.$$

Then there is:

$$n = \frac{C_t}{C_t'} = \frac{C_t}{\frac{C_t}{n_1} + \frac{C_t}{n_2}} = \frac{n_1 n_2}{n_1 + n_2}$$

When n exceeds 1, the solution according to the invention moreover makes it possible to obtain a gain of surface area with respect to the value of the capacitances as compared with the prior art case (with $R_s$ equal). The value of n is higher as $R_s$ is lower. In other terms: when it is used with current sources of low internal impedance, the invention has the advantage of a diminution of the overall surface area of the capacitors with respect to the prior art solution.

Numerical application:
h = 70
$R_1 = 100 \ 1$
$R_{12} = R_2 = 290 \ 1$
$R_{51} = R_{52} = 15 \ kl$
$R_f = 2R_{51} = 2R_{61} = 5840 \ 1$
$n_1 = 3.1 \ n_2 = 3.6 \ n = 1.66$.

In practice, the factor n of improvement of the overall value of the capacitances can even be larger because it is possible to utilize an amplifier whose $\alpha$ term is higher than before since the value of $R_{51}$ and $R_{52}$ can be chosen to be higher without difficulty. Therefore, a higher value of the mutual impedance in open circuit $\alpha R_f$ is obtained, which is allowed to be slightly reduced by diminishing the value of the capacitances (which increases the value of k).

This results in that:

$$n = \frac{n_0 n_1 n_2}{n_0 n_1 + n_2}$$

with $n_0 > 1$ (in practice of the order of 1.5).

In the case of the preceding numerical application, there is obtained: $n = 2$, for $n_0 = 1.5$.

Figure 4:
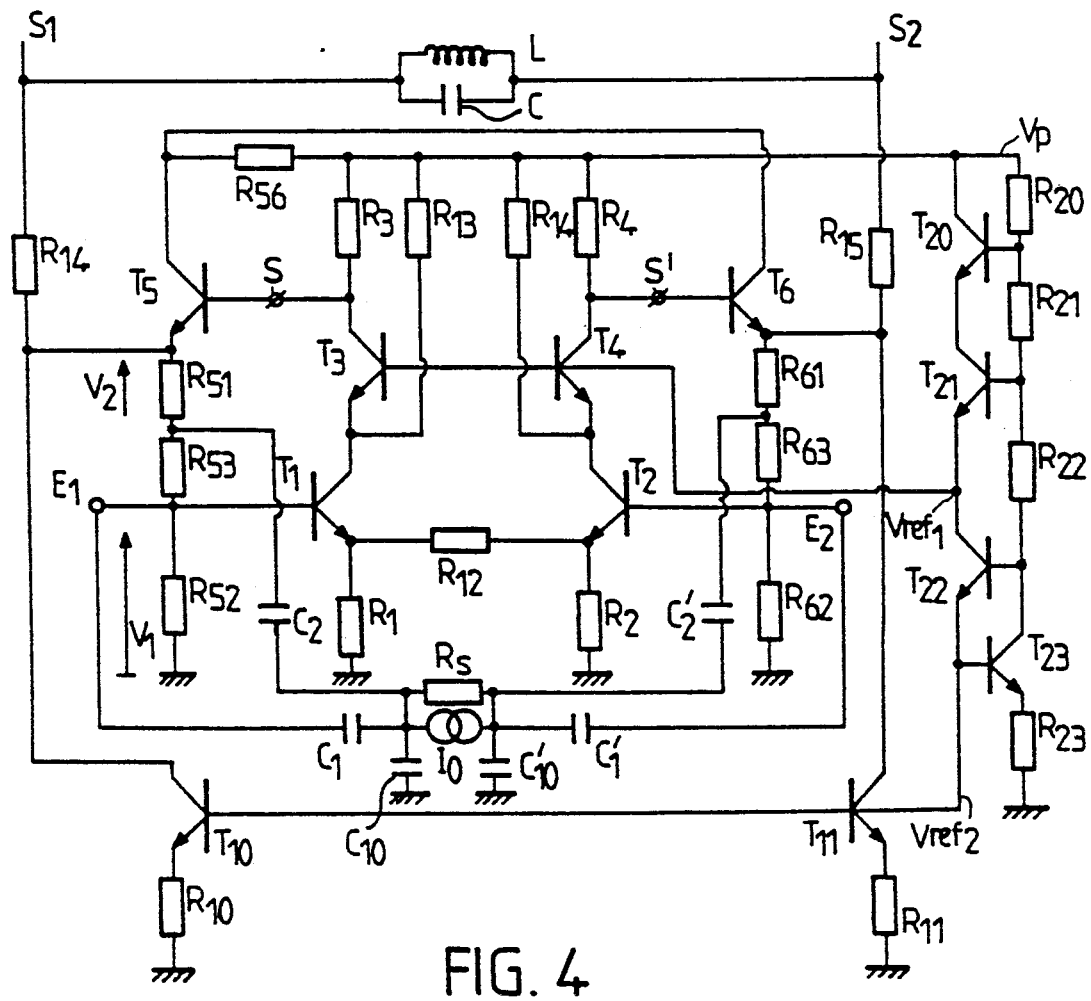
FIG. 4 shows a preferred embodiment of an amplifier according to the invention.

FIG. 4 shows a preferred embodiment of the invention, especially intended for the manufacture of an intermediate frequency amplifier (FI) and more particularly a mutual impedance amplifier intended to amplify the signals originating from a television mixer. In FIG. 4, the elements corresponding to FIG. 1 (transistors $T_1$ to $T_4$; resistors $R_{12}$, $R_3$ and $R_4$) are provided with the same reference symbols. The current sources $I_1$ and $I_2$ are constituted by resistors $R_1$ and $R_2$, respectively, connected between the emitters of the transistors $T_1$ and $T_2$, respectively, and the common mode terminal. The resistors $R_1$ and $R_2$ contribute to the amplification of the stage and it is necessary to replace in the preceding formula $R_{12}$ by $R'_{12}$ with $$\frac{1}{R'_{12}} = \frac{1}{R_{12}} + \frac{1}{R_1 + R_2}.$$

Current sources $I_3$ and $I_4$, which may be present, are constituted by resistors $R_{13}$ and $R_{14}$, respectively, connected between the supply voltage source $V_p$ and the collectors of the transistors $T_1$ and $T_2$, respectively.

Reference voltages are generated in a conventional manner from a chain of resistors ($R_{20}$, $R_{21}$, $R_{22}$) connected in series between the supply voltage source $V_p$ and a current source $T_{23}$, $R_{23}$ associated with transistors ($T_{20}$, $T_{21}$, $T_{22}$), whose collector-emitter paths are connected in series and whose bases are connected to the junction points between the resistors $R_{20}$ and $R_{21}$, $R_{21}$ and $R_{22}$, and $R_{22}$ and $R_{23}$, respectively. Vref1 is thus supplied to the emitter of $T_{21}$.

Moreover, in order to obtain a mutual impedance amplifier, a negative feedback is provided. Transistors $T_5$ and $T_6$ (optionally) are each arranged as an emitter follower coupled to the collectors of transistors $T_3$ and $T_4$, respectively. Their bases are thus connected for this purpose to the collectors of the transistors $T_3$ and $T_4$, respectively. The collectors of the transistors $T_5$ and $T_6$ are interconnected and are connected to the supply voltage source $V_p$ through a common resistor $R_{56}$. In addition, their emitters are connected each to a current source ($T_{10}$, $R_{10}$) and ($T_{11}$, $R_{11}$), respectively, transistors $T_{10}$ and $T_{11}$ have for this purpose their bases supplied with a reference potential Vref2. For this purpose, their bases are connected to the emitter of the transistor $T_{22}$, which is in turn connected to the base of the transistor $T_{23}$. The negative feedback is obtained due to, on the one hand, the resistor $R_{51}$ in series with the capacitor $C_2$ and with the emitter of the transistor $T_5$ and, on the other hand, $R_{61}$ in series with the capacitor $C'_2$ and with the emitter of the transistor $T_6$. Resistors $R_{52}$ and $R_{62}$ can moreover be arranged between the bases of the transistors $T_1$ and $T_2$, respectively, and the common mode terminal in order to ensure the voltage shifts by means of $R_{51}$ and $R_{61}$.

For the inputs, the mutual differential impedance $Z_{21}$ then has the value (on the assumption that $R_{51} = R_{61}$ and $R_{52} = R_{62}$):

$$Z_{21} = -\frac{2R_{51}\dfrac{R_x A_v}{R_x + 2R_{51}}}{1 + \dfrac{R_x A_v}{R_x + 2R_{51}}} = \frac{-2R_{51}a'}{1 + a'}$$

with $$\frac{1}{R_x} = \frac{1}{2R_{52}} + \frac{1}{R_s} + \frac{1}{Z_i} \text{ et } a' = \frac{R_x A_v}{R_x + 2R_{51}}$$

with $Z_i$ = input impedance of the differential pair ($T_1$, $T_2$), and $A_v$ = voltage amplification of the differential stage.

With $a' \gg 1$, $Z_{21}$ has the value $-2R_{51}$.

$Z_{21}$ being specified and $R_{51}$ being chosen (this resistor is in fact determinative), the current I traversing the resistors $R_1$ and $R_2$ is determined so as to ensure the linearity of the differential stage (for example I = 1.5 mA).

If the current sources $I_3$ and $I_4$ (resistors $R_{13}$ and $R_{14}$) are utilized, the operating conditions are as follows:

$$V_2 > V_3$$

$$V_1 + V_2 + V_{BE5} + R_3 I' < V_p$$

with:
$V_1$ = static potential difference at the terminals of $R_{52}$
$V_2$ = static potential difference at the terminals of $R_{51} + R_{53}$
$V_3$ = half of the maximum amplitude of the output signal (for example at the emitter of the transistor $T_5$)
$I'$ = static current through the resistors $R_3$ and $R_4$.
$V_{BE5}$ = base-emitter voltage of the transistors $T_5$ and $T_6$ (0.7 V).

The filter of the amplifier FI is constituted by a parallel circuit LC connected between its two outputs $S_1$ and $S_2$. These outputs are connected to the emitters of the transistors $T_5$ and $T_6$ through resistors $R_{14}$ and $R_{15}$, respectively.

The preceding stage (mixer) is represented as a current source $I_0$ parallel to a resistor $R_s$ and two capacitors $C_{10}$ and $C'_{10}$ each having a terminal connected to ground. The current source $I_0$ is connected to the inputs $E_1$ and $E_2$ through the series capacitors $C_1$ and $C'_1$, respectively. Since the capacitances $C_1$ and $C'_1$ are intended to be integrated, therefore their capacitance value must be as small as possible, but compatible with a small reactive part at the negative feedback input of the amplifier.

The current source $I_0$ is connected on the one hand to the series arrangement of the resistor $R_{51}$ and the capacitor $C_2$ and on the other hand to the series arrangement of the resistor $R_{61}$ and the capacitor $C'_2$. The resistors $R_{53}$ and $R_{63}$ are advantageously arranged in series with on the one hand $R_{51}$ and $R_{52}$ and on the other hand $R_{61}$ and $R_{62}$. Their value is chosen so as to correct any input level shifts. Therefore, the resistors must be sufficiently small to correct these shifts, but sufficiently large not to influence the negative feedback of the amplifier, that is to say that $R_{53}$ and $R_{63}$ have a value several times larger than that of $R_{51}$ and $R_{61}$.

For example, there is: $R_{51} = R_{61} = 3$ kl, $R_{53} = R_{63} = 10$ kl, $R_{52} = R_{62} = 15$ kl, $R_1 = R_2 = 300$ l, $R_{12} = 100$ l, $R_3 = R_4 = 3$ kl, while A = 70.

In practice, if the parasitic elements are taken into account, the amplification is smaller than the theoretical value given above (then A $\approx$ 40).

Moreover, the resistors $R_{52}$ and $R_{62}$ are advantageous because they permit the determination of the potentials from the static viewpoint. There is;

$$\frac{V_1}{V_1 + V_2} = \frac{R_{52}}{R_{51} + R_{52} + R_{53}} = \frac{R_{62}}{R_{61} + R_{62} + R_{63}}$$

I claim:
1. An amplifier comprising: a single differential amplifier having an inverting and a non-inverting input as well as a non-inverting and an inverting output, the inverting and the non-inverting input being coupled via a first and a second capacitor to an inverting and a non-inverting input terminal, respectively, and the non-inverting and the inverting output being coupled to a non-inverting and an inverting output terminal, respectively, the inverting and the non-inverting input termi- nals being coupled via a first and a second feedback resistor to the non-inverting and the inverting output of the differential amplifier, respectively, characterized in that the amplifier comprises a third and a fourth capacitor connected in series with the first and the second feedback resistor, respectively, between the inverting and the non-inverting input terminals and the non-inverting and the inverting output.

2. An amplifier comprising: a differential stage having a first and a second input as well as a first and a second output, the first and the second input being coupled through a first and a second capacitor to a first and a second input terminal, respectively, and the first and the second output being coupled to a first and a second output terminal, respectively, the input terminals being coupled through a first and a second feedback resistor to the output terminals, and a third and a fourth capacitor connected in series with the first and the second feedback resistor, respectively, between the input terminals and the output terminals, characterized in that the differntial stage is of the cascode type and comprises a first and a second transistor, whose emitters are coupled to a first and a second current source, respectively, and are coupled to each other via a third resistor, and whose collectors are coupled to a supply voltage terminal via an active load including the collector-emitter paths of a third and a fourth transistor, respectively, in series with a fourth and a fifth resistor, respectively, the third and fourth transistors having their bases coupled to a reference voltage terminal.

3. An amplifier as claimed in claim 2, which further comprises a fifth and a sixth transistor, whose bases are coupled to the collectors of the third and the fourth transistors, respectively, whose emitters are coupled to said first and second feedback resistors, respectively and whose collectors are coupled to said reference voltage terminal.

4. An amplifier as claimed in claim 2 further comprising a sixth resistor coupled between a junction point between the first resistor and the third capacitor and the base of the first transistor, and a seventh resistor coupled between a junction point between the second resistor and the fourth capacitor and the base of the second transistor.

5. An amplifier comprising: a differential stage having a first and a second input as well as a first and a second output, the first and the second input being coupled through a first and a second capacitor to a first and a second input terminal, respectively, and the first and the second output being coupled to a first and a second output terminal, respecitively, the input terminals being coupled through a first and a second feedback resistor to the output terminals, and a third and a fourth capacitor connected in series with the first and the second feedback resistor, respectively, between the input terminals and the output terminals, and wherein the value of each of the first, second, third and fourth capacitors is chosen such that the differential input impedance of the amplifier has a reactive part which does not exceed 15% of the impedance in the whole range of operting frequencies of the amplifier.

6. An amplifier as claimed in claim 5, which comprises a further resistor coupled between the base of the first transistor and another supply voltage terminal and another resistor coupled between the base of the second transistor and said another supply voltage terminal.

7. An amplifier as claimed in claim 3 further comprising a sixth resistor coupled between a junction point between the first resistor and the third capacitor and the base of the first transistor, and a seventh resistor coupled between a junction point between the second resistor and the fourth capacitor and the base of the second transistor.

8. An amplifier as claimed in claim 2, wherein the value of each of the first, second, third and fourth capacitors is chosen such that the differential input impedance of the amplifier has a reactive part which does not exceed 15% of the impedance in the whole range of operating frequencies of the amplifier.

9. An amplifier as claimed in claim 3, wherein the value of each of the first, second, third and fourth capacitors is chosen such that the differential input impedance of the amplifier has a reactive part which does not exceed 15% of the impedance in the whole range of operating frequencies of the amplifier.

10. An amplifier as claimed in claim 2, which comprises a further resistor coupled between the base of the first transistor and another supply voltage terminal and another resistor coupled between the base of the second transistor and said another supply voltage terminal.

11. An amplifier as claimed in claim 3, which comprises a further resistor coupled between the base of the first transistor and another supply voltage terminal and another resistor coupled between the base of the second transistor and said another supply voltage terminal.

12. An amplifier as claimed in claim 2 wherein said differential stage comprises a single differential amplifier including said first and second transistors each with a base, the base of the first transistor constituting said first input and the base of the second transistor constituting said second input, said first and second inputs comprising an inverting and a non-inverting input, respectively, of the single differential amplifier.

* * * * *